US012279417B2

(12) United States Patent
Liu

(10) Patent No.: US 12,279,417 B2
(45) Date of Patent: Apr. 15, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Xiang Liu, Hefei (CN)

(73) Assignee: CHANGXIN MEMORY TECHNOLGIES, INC., Hefei (CN)

( * ) Notice: Subject to any disclaimer, the term of this patent is extended or adjusted under 35 U.S.C. 154(b) by 415 days.

(21) Appl. No.: 17/658,427

(22) Filed: Apr. 7, 2022

(65) Prior Publication Data

US 2023/0043347 A1 Feb. 9, 2023

Related U.S. Application Data

(63) Continuation of application No. PCT/CN2022/070757, filed on Jan. 7, 2022.

(30) Foreign Application Priority Data

Aug. 6, 2021 (CN) .......................... 202110904551.0

(51) Int. Cl.
*H10B 12/00* (2023.01)
*H01L 29/08* (2006.01)

(52) U.S. Cl.
CPC ....... *H10B 12/488* (2023.02); *H01L 29/0843* (2013.01); *H10B 12/30* (2023.02)

(58) Field of Classification Search
CPC ............ H01L 29/0843; H01L 29/4236; H10B 12/053; H10B 12/30; H10B 12/03; H10B 12/34; H10B 12/488
See application file for complete search history.

(56) References Cited

U.S. PATENT DOCUMENTS 8,896,059 B1  11/2014  Kim
2008/0173921 A1* 7/2008 Li .......................... H10B 69/00
                                                           257/E21.409
(Continued)

FOREIGN PATENT DOCUMENTS

CN    106571384 B    2/2018
JP    200323104 A    1/2003
(Continued)

OTHER PUBLICATIONS

Supplementary European Search Report in the European application No. 22712490.6, mailed on Nov. 15, 2023. 8 pages.
(Continued)

Primary Examiner — Michelle Mandala
Assistant Examiner — Kevin Quinto
(74) Attorney, Agent, or Firm — Syncoda LLC; Feng Ma

(57) ABSTRACT

A semiconductor structure includes a substrate with a plurality of word line trenches and source/drain regions each adjacent to each word line trench; a word line located in the word line trench, which includes a first conductive layer located at a bottom of the word line trench, a single junction layer and a second conductive layer stacked in sequence, in which a projection of the word line on a sidewall of the word line trench and the projection of the source/drain region on the sidewall of the word line trench have an overlapping region with a preset height, and when a voltage applied to the word line is less than a preset voltage, a resistance of the single junction layer is greater than the preset resistance, to make the first conductive layer and the second conductive layer disconnected.

16 Claims, 8 Drawing Sheets

(56) References Cited

U.S. PATENT DOCUMENTS

| | | |
|---|---|---|
| 2012/0299090 A1 | 11/2012 | Kim |
| 2015/0093869 A1 | 4/2015 | Juengling |
| 2019/0027582 A1 | 1/2019 | Lee et al. |
| 2019/0393320 A1 | 12/2019 | Yoo et al. |

FOREIGN PATENT DOCUMENTS

| | | |
|---|---|---|
| KR | 20110130158 A | 12/2011 |
| KR | 20120132264 A | 12/2012 |
| KR | 20160073143 A | 6/2016 |

OTHER PUBLICATIONS

Japanese patent office action in Application No. 2023-535878, mailed on Aug. 6, 2024.
KR patent office action in application No. 10-2023-7021809, mailed on Jul. 5, 2024.

\* cited by examiner

SEMICONDUCTOR STRUCTURE AND MANUFACTURING METHOD THEREOF

CROSS-REFERENCE TO RELATED APPLICATIONS

This is a continuation of International Application No. PCT/CN2022/070757 filed on Jan. 7, 2022, which claims priority to Chinese Patent Application No. 202110904551.0 filed on Aug. 6, 2021. The disclosures of these applications are hereby incorporated by reference in their entirety.

BACKGROUND

Dynamic Random Access Memory (DRAM) is composed of multiple repeated memory cells. Each memory cell usually includes a capacitor structure and a transistor. The gate of the transistor is composed of a word line, the drain of the transistor is connected to a bit line, and the source of the transistor is connected to the capacitor structure. A voltage signal on the word line can control the transistor to turn on or off, and then the data information stored in the capacitor structure can be read through the bit line, or the data information can be written into the capacitor structure through the bit line for storage.

SUMMARY

The disclosure relates to the technical field of semiconductors, in particular to a semiconductor structure and a manufacturing method thereof.

In order to achieve the above objectives, the embodiments of the disclosure provide the following technical solutions.

The embodiments of the disclosure provide a semiconductor structure, which includes a substrate, with a plurality of word line trenches and source/drain regions each adjacent to each word line trench; a word line, located in each word line trench, and including a first conductive layer, a single junction layer and a second conductive layer stacked in sequence, in which the first conductive layer is located at a bottom of the word line trench, and the projection of the word line on a sidewall of the word line trench and the projection of the source/drain region on the sidewall of the word line trench have an overlapping region with a preset height, in which in the case that a voltage applied to the word line is less than a preset voltage, a resistance of the single junction layer is greater than a preset resistance, to make the first conductive layer and the second conductive layer disconnected.

The embodiments of the disclosure also provide a method for manufacturing a semiconductor structure, which includes: providing a substrate, on which a plurality of word line trenches and source/drain regions are formed, in which each source/drain region adjacent to each of the word line trench; forming a first conductive layer in each of the word line trench; forming a single junction layer on the first conductive layer; forming a second conductive layer on the single junction layer, in which the first conductive layer, the single junction layer and the second conductive layer form a word line, and a projection of the word line on a sidewall of the word line trench and a projections of the source/drain region on the sidewall of the word line trench have an overlapping region with a preset height.

BRIEF DESCRIPTION OF THE DRAWINGS

In order to more clearly explain the embodiments of the disclosure or the technical solutions in the relate art, the following will briefly introduce the drawings that need to be used in the description of the embodiments or some implementations. Obviously, the drawings in the following description are some embodiments of the disclosure, and for ordinary technicians in the field, other drawings can be obtained according to these drawings without involving creative efforts.

REFERENCE SIGNS

100—substrate;
101—word line trench;
102—source/drain region;
200—word line;
201—first conductive layer;
202—single junction layer;
203—second conductive layer.

DETAILED DESCRIPTION

In some implementations, the gate of the transistor is composed of a word line, which is buried in a word line trench in a base including a P-type substrate and an N-type doped region located on the surface layer of the P-type substrate. The part of the P-type substrate close to the word line trench is used as the channel region of the transistor, and the N-type doped regions on both sides of the word line trench are the source region and the drain region of the transistor. When the word line and the source/drain region are projected on a side wall of the word line trench respectively, the projected parts of the word line and the source/drain region form an overlapping region. When the word line of the transistor is turned on, electrons may be attracted to the overlapping region. The larger the overlapping region is, the smaller the on-resistance of the source/drain region and the channel region are, and the larger the driving current of the transistor is.

However, when the word line of the transistor is turned off, a strong electric field is formed in the overlapping region to attract tunneling current. The larger the overlapping region is, the more serious the phenomenon of gate-induced drain leakage (GIDL) is.

Figure 1:
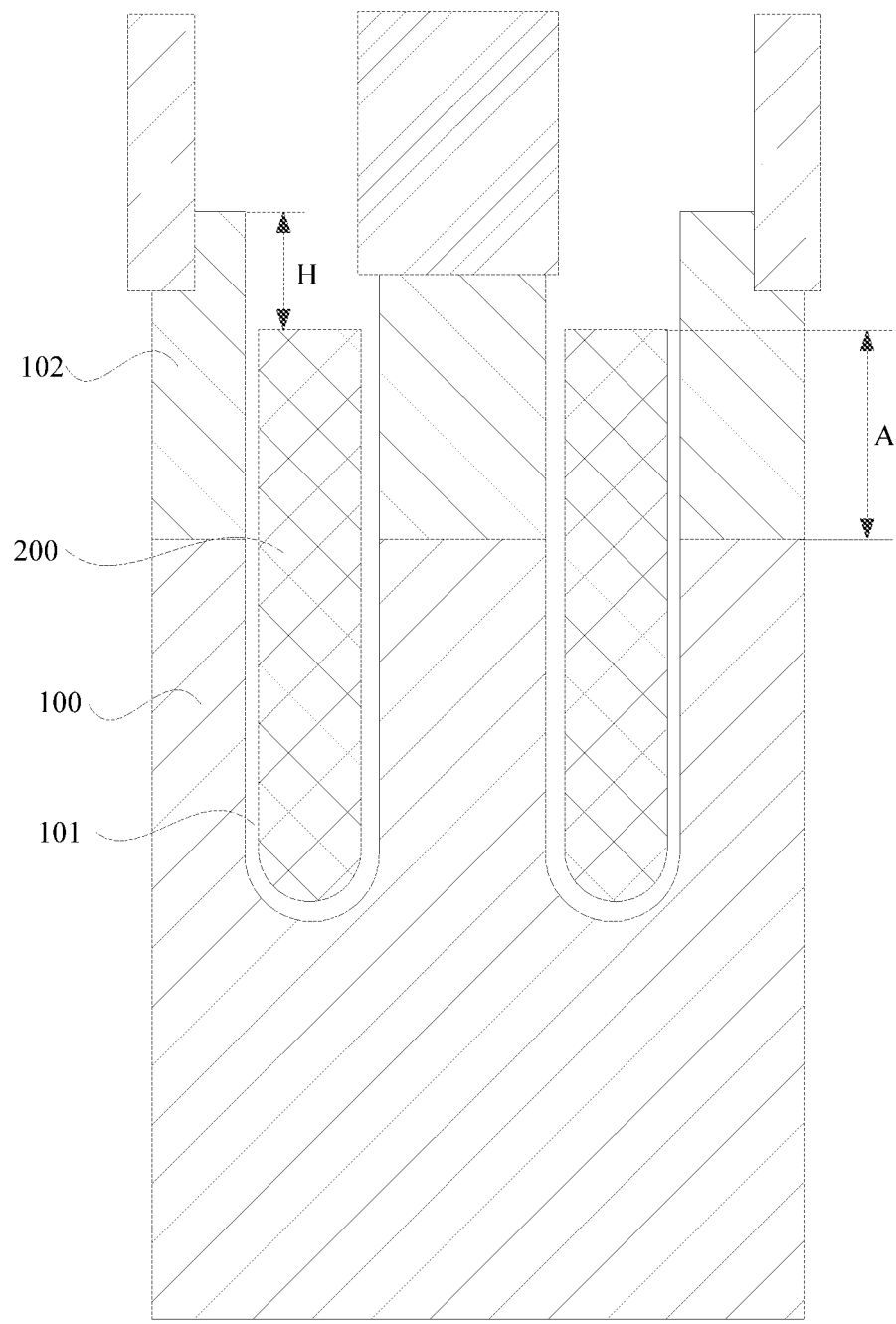
FIG. 1 is a structural diagram of a semiconductor structure in some implementations.

As mentioned above, the dynamic random access memory in some implementations has a serious problem of GIDL leakage. According to the inventor's research, the reasons causing this problem are as follows. As shown in FIG. 1, the distance from the top of a word line 200 to the upper surface of the substrate 100 (indicated by H in the embodiments of this disclosure) is reduced, and the overlapping region of the projections of the word line 200 and a source/drain region 102 on a sidewall of a word line trench 101 is increased (indicated by A in the embodiments of this disclosure). When the word line 200 is turned on, the overlapping region A can attract electrons in a doped region of the substrate 100, so as to reduce the resistance of the overlapping region A between the source/drain region 102 and the word line 200, thereby increasing driving current of the transistor.

Figure 2:
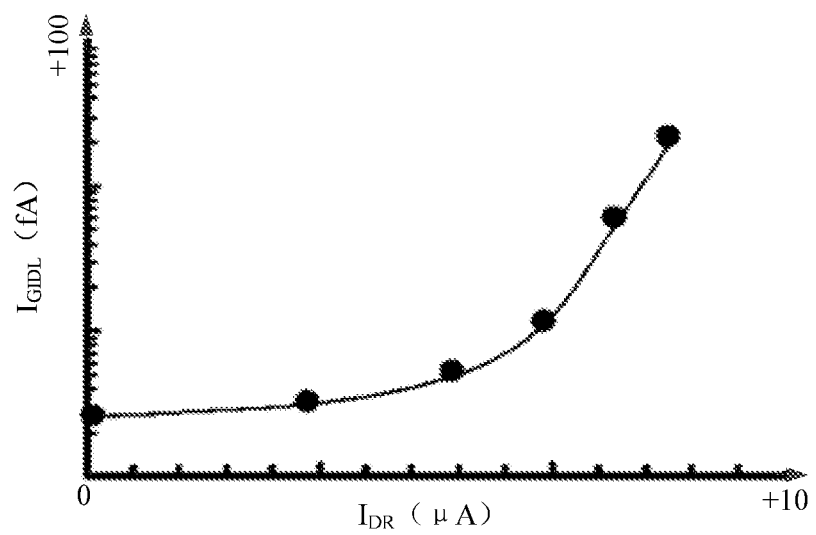
FIG. 2 is a schematic diagram of the relationship between the driving current and GIDL leakage after increasing the height of the overlap region between the word line and the source/drain region in the semiconductor structure.

However, when the word line is in an off state and a working voltage is applied to the source and drain, the electrons near to the overlapping region A can tunnel between the gate and the source/drain due to a strong electric field and thus form a current, i.e., GIDL leakage. The larger the size of the overlapping region A is, the more serious the GIDL leakage phenomenon is, leading to a low reliability of the semiconductor structure. As shown in FIG. 2, with the increase of the size of overlapping region A, the driving current increases, and the GIDL leakage phenomenon becomes more and more serious.

In order to solve the above problem, the embodiments of the disclosure provide a semiconductor structure and its manufacturing method. In the semiconductor structure, a word line includes a first conductive layer, a single junction layer and a second conductive layer, which are sequentially stacked with the first conductive layer located at the bottom of the word line trench. When the single junction layer is in a conductive state, the first conductive layer and the second conductive layer are connected through the single junction layer, and the overlapping region A between the source/drain region and the word line can attract electrons in the doped regions of the substrate, thus reducing the resistance of the overlapping region A of the source/drain region and the word line, thereby increasing the driving current of the transistor. While when the single junction layer is in an off state, the first conductive layer and the second conductive layer are disconnected, so that the voltage on the second conductive layer is 0 V. Therefore, the second conductive layer can obviously reduce the electric field intensity in the overlapping region A, and thus mitigate the phenomenon of forming a current due to electrons tunneling between the word line and the source/drain, and mitigate the GIDL leakage phenomenon.

In order to make the above-mentioned objects, features and advantages of the embodiments of the disclosure more obvious and understandable, the technical solutions in the embodiments of the disclosure are clearly and completely described below with reference to the drawings in the embodiments of the disclosure. It is apparent that, the described embodiments are only part of the embodiments of the disclosure, not all of them. Based on the embodiments in this disclosure, all other embodiments obtained by one of ordinary skill in the art without involving creative efforts are within the protection scope of in this disclosure.

Figure 3:
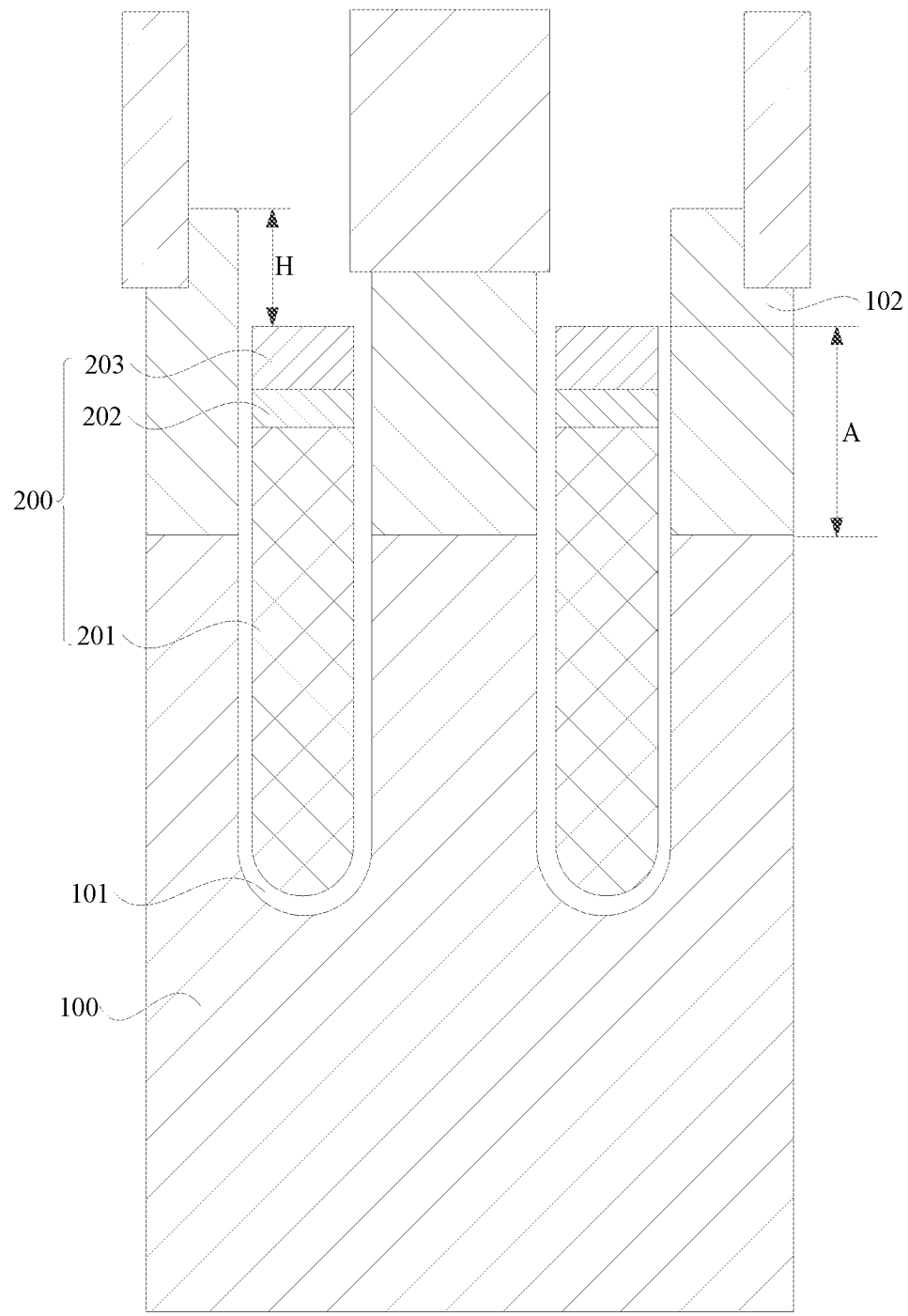
FIG. 3 is a schematic structural diagram of a semiconductor structure provided by an embodiment of the disclosure.
Figure 4:
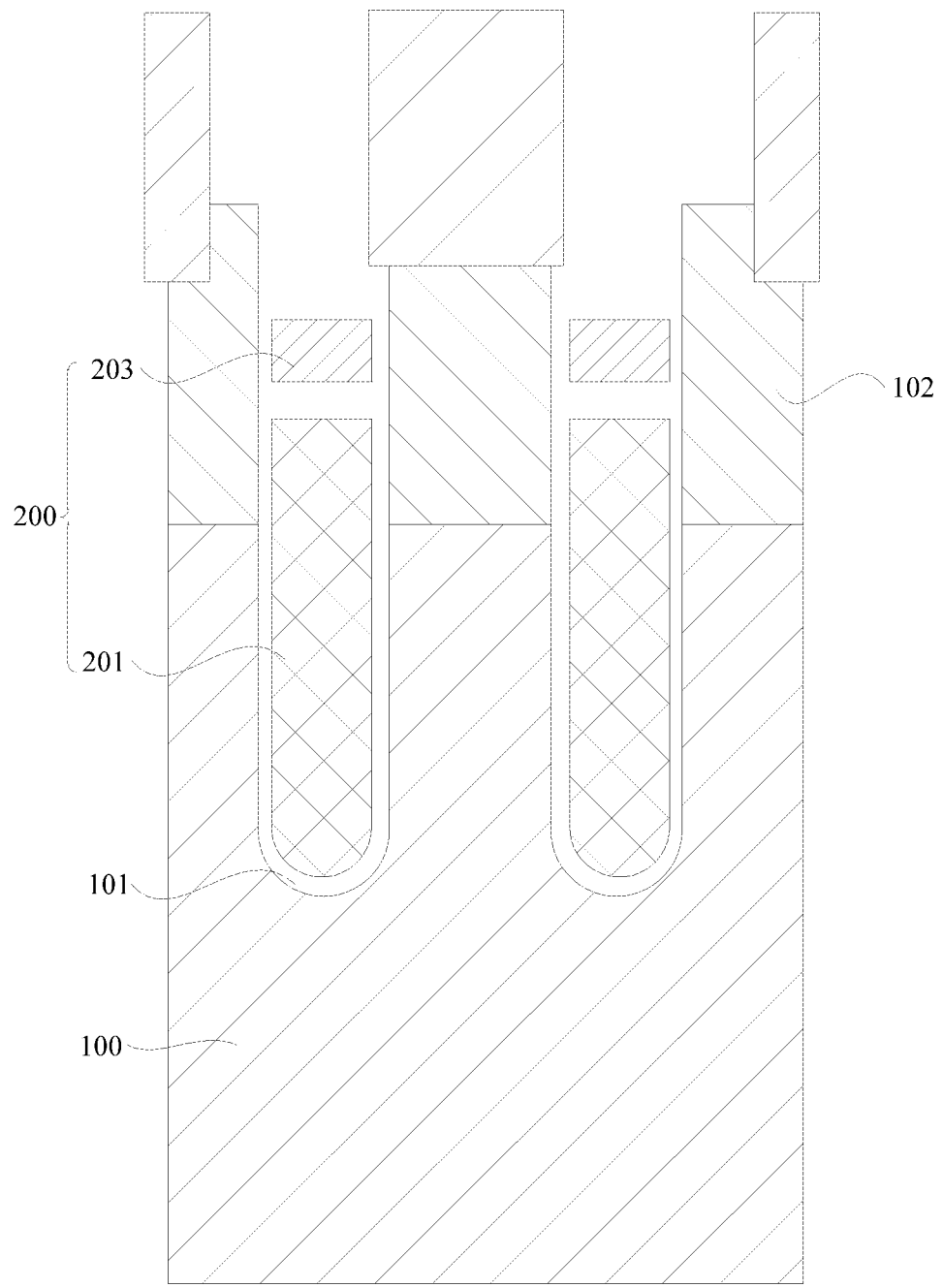
FIG. 4 is a schematic diagram of a use state of a semiconductor structure provided by an embodiment of the disclosure.
Figure 5:
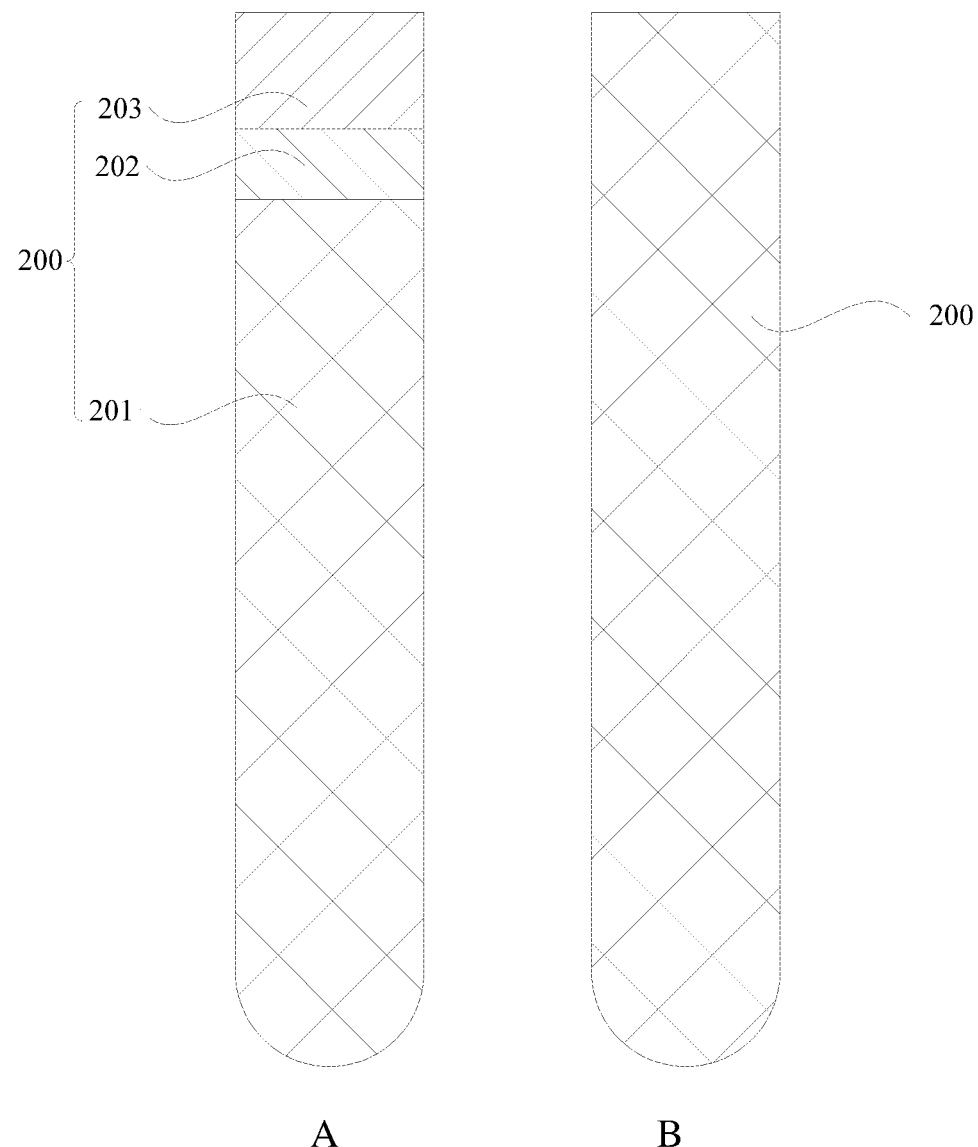
FIG. 5 is a schematic diagram of a use state of the word line in FIG. 3.
Figure 6:
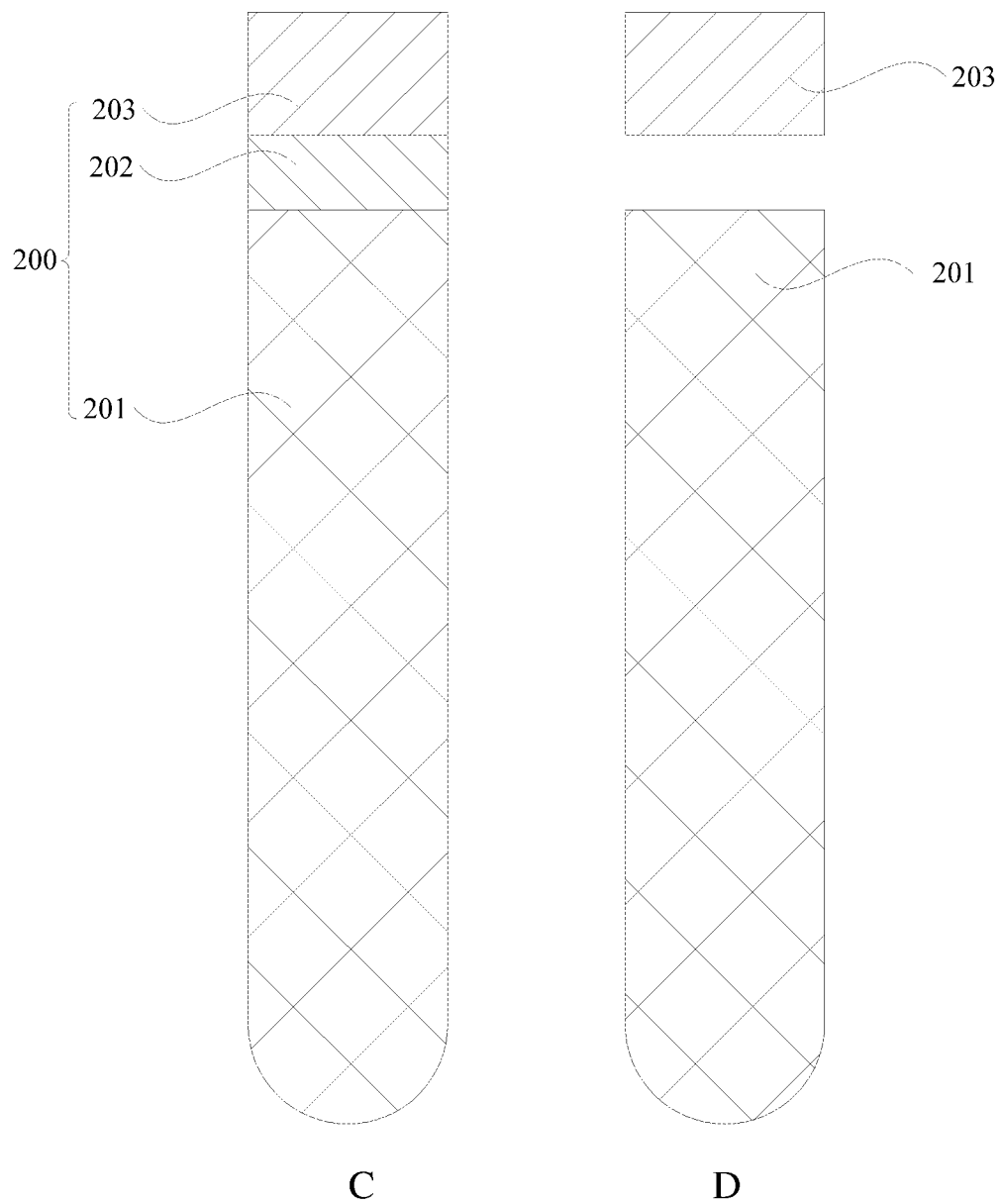
FIG. 6 is a schematic diagram of another use state of the word line in FIG. 3.

FIG. 3 is a schematic structural diagram of a semiconductor structure provided by an embodiment of the disclosure; FIG. 4 is a schematic diagram of a use state of a semiconductor structure provided by an embodiment of the disclosure; FIG. 5 is a schematic diagram of a use state of the word line in FIG. 3; and FIG. 6 is a schematic diagram of another use state of the word line in FIG. 3.

As shown in FIGS. 3 to 6, the semiconductor structure provided by the embodiments of the disclosure includes a substrate 100 and a word line 200.

In the semiconductor structure, the substrate 100 has several word line trenches 101 and source/drain regions 102, each of the source/drain region 102 is adjacent to each of the word line trench 101.

The substrate 100 may be a crystalline semiconductor material, such as a silicon (Si) substrate 100, and the substrate 100 may also be a germanium (Ge) substrate 100, a silicon on insulator (SOI), a silicon germanium (SiGe) substrate 100, a silicon carbide (SiC) or gallium nitride (GaN) substrate 100, etc., for which the embodiments of the disclosure are not particularly limited.

The substrate 100 includes a core region and a peripheral region located at the periphery of the core region. The core region includes multiple active areas and shallow trench isolation regions for isolating the active regions. The active regions can be arranged in an array.

Capacitors are subsequently formed above the core area of the substrate 100, and peripheral circuits such as transistors are subsequently formed above the peripheral area of the substrate 100.

A word line trench 101 is formed in each active area, and a semiconductor layer can be arranged in the substrate 100. For example, the substrate 100 includes a P-type substrate 100 and an N-type doped region on the surface of the P-type substrate 100. The part of the P-type substrate 100 near the word line trench serves as the channel region of the transistor, and the N-type doped regions on both sides of the word line trench serve as a source region and a drain region of the transistor.

The word line 200 is located in the word line trench 101. The word line 200 includes a first conductive layer 201, a single junction layer 202 and a second conductive layer 203 stacked in sequence. The first conductive layer 201 is located at the bottom of the word line trench 101. The projection of the word line 200 on the sidewall of the word line trench 101 and the projection of the source/drain region 102 on the sidewall of the word line trench 101 have an overlapping region A with a preset height. When a voltage applied to the word line 200 is less than a preset voltage, the resistance of the single junction layer is greater than the preset resistance, so that the first conductive layer 201 and the second conductive layer 203 are disconnected.

It can be understood that, as shown in FIGS. 3 and 5, when the voltage applied to the word line 200 is greater than the preset voltage, the resistance of the single junction layer 202 is less than a preset resistance, and the first conductive layer 201 and the second conductive layer 203 are connected through the single junction layer 202. In the case, the word line 200 in figure A of FIG. 5 is equivalent to the word line in figure B of FIG. 5, and the heights of the overlapping region A of the projections of the word line 200 and the source/drain region 102 respectively on the sidewall of the word line trench are increased, thereby increasing the driving current. When the voltage applied to the word line 200 is less than the preset voltage, the resistance of the single junction layer 202 is greater than the preset resistance. As shown in FIG. 4 and FIG. 6, the single junction layer 202 is in an off state, and the single junction layer 202 is used for breakoff of the first conductive layer 201 and the second conductive layer 203 so that the first conductive layer 201 and the second conductive layer 203 are disconnected. In the case, the word line 200 in figure C of FIG. 6 is equivalent to the word line of figure D of FIG. 6. The second conductive layer 203 can shield the electric field of the first conductive layer 201, thereby reducing the electric field intensity of the overlapping region A of the projections of the word line 200 and the source/drain region 102 on the sidewall of the word line trench, and further mitigating the GIDL leakage phenomenon.

In the disclosure, when the single junction layer 202 is in the conductive state, the first conductive layer 201 and the second conductive layer 203 are connected through the single junction layer 202, and the overlapping region A of the source/drain region 102 and the word line 200 attract electrons in the doped region of the substrate 100, reducing the resistance of the overlapping region A of the source/drain region 102 and the word line 200, thereby increasing the driving current of the transistor. While, when the single junction layer 202 is in the off state, the first conductive layer 201 and the second conductive layer 203 are disconnected, so that the voltage on the second conductive layer 203 is 0 V, and the second conductive layer 203 can obviously reduce the electric field intensity in the overlapping region A, which mitigates the phenomenon of forming a current due to electrons tunneling between the word line 200 and the source/drain, and thus mitigate the GIDL leakage phenomenon.

It should be noted that the height of the overlapping region A of the projections of the word line 200 and the source/drain region 102 on the sidewall of the word line trench is set for the purpose of increasing the driving current of transistors in the semiconductor structure, and the specific sizes are not specifically limited in this embodiment.

In the semiconductor structure, the preset voltage can be 1.2V. When the voltage applied by the word line 200 is less than 1.2V, the resistance of the single junction layer 202 is greater than the preset resistance, so that the first conductive layer 201 and the second conductive layer 203 are disconnected.

In some alternative embodiments, the projection of at least part of the second conductive layer 203 on the sidewall of the word line trench 101 lies within the projection of the source/drain region 102 on the sidewall of the word line trench 101.

It can be understood that at least part of the second conductive layer 203 refers to part of the second conductive layer 203 or the whole conductive layer. The overlapping region A of the word line 200 and the source/drain region 102 includes at least part of the second conductive layer 203, so that when the single junction layer 202 is in the off state, the first conductive layer 201 and the second conductive layer 203 are disconnected, and the voltage of the second conductive layer 203 is 0 V. The second conductive layer 203 can shield the electric field near the first conductive layer 201, and thus mitigates the phenomenon of forming a current due to electrons tunneling between the word line 200 and the drain, thereby mitigating the GIDL leakage phenomenon.

Further, the top of the first conductive layer 201 is lower than the bottoms of the source/drain region 102.

It can be understood that by setting the top of the first conductive layer 201 to be lower than the bottom of the source/drain region 102, the overlapping region A of the word line 200 and the source/drain region 102 are composed of the second conductive layer 203, or the second conductive layer 203 and the single junction layer 202. When the single junction layer 202 is in the off state, the distance between the electrons near the first conductive layer 201 and the source/drain region 102 is far. Furthermore, the second conductive layer 203 can shield the electric field near the first conductive layer 201, reducing the electric field intensity of the overlapping region A between the word line 200 and the source/drain region 102, and avoiding the current generated by electrons tunneling the source/drain region 102, so as to increase the driving current of the transistor and mitigate the GIDL leakage phenomenon.

Further, the top of the second conductive layer 203 is flush with the top of the source/drain region 102.

By setting the top of the second conductive layer 203 to be flush with the top of the source/drain region 102, the height of the overlapping region A of the word line 200 and the source/drain region 102 can be increased, thereby increasing the driving current of the transistor. Meanwhile, the overlapping region A mainly includes the second conductive layer 203, so that when the single junction layer 202 is in the off state, the distance between the electrons near the first conductive layer 201 and the source/drain region 102 is far. The second conductive layer 203 can shield the electric field near the first conductive layer 201, reduce the electric field intensity in the overlapping region A of the word line 200 and the source/drain region 102, and avoid formation of the current due to electrons tunneling with the source/drain region 102, so as to increase the driving current of the transistor and mitigate the GIDL leakage phenomenon.

In other alternative embodiments, the projection of the source/drain region 102 on the sidewall of the word line trench 101 covers the projection of the second conductive layer 203 on the sidewall of the word line trench 101, so that the GIDL leakage phenomenon can be mitigated while increasing the driving current of the transistor.

On the basis of the above embodiments, when the voltage applied to the word line 200 is less than the preset voltage, the resistance of the single junction layer 202 is greater than the preset resistance, so that the first conductive layer 201 and the second conductive layer 203 are disconnected, in which the preset resistance is the critical resistance of electrical connection of the first conductive layer 201 and the second conductive layer 203.

In the embodiments of the disclosure, the single junction layer 202 includes a first resistance and a second resistance, and the resistance value of the single junction layer 202 can vary between the first resistance and the second resistance under different voltages, in which the first resistance is greater than the second resistance. The resistance of the single junction layer 202 is the second resistance when the single junction layer 202 is in the conductive state. When the single junction layer 202 is in the off state, the resistance of the single junction layer 202 is the first resistance.

It can be understood that when the voltage applied to the word line 200 is less than the preset voltage, the first resistance is a high-resistance state resistance, which is greater than the conductive resistance of the first conductive layer 201 and the second conductive layer 203, and thus the first conductive layer 201 and the second conductive layer 203 are disconnected through the single junction layer 202. In this case, the voltage of the second conductive layer 203 is 0 V, so that the second conductive layer 203 can be used for shielding the electric field of the word line 200. When the voltage applied to the word line 200 is greater than the preset voltage, the second resistance is a low-resistance state resistance, which is less than the conductive resistance of the first conductive layer 201 and the second conductive layer 203, so that the first conductive layer 201 and the second conductive layer 203 can be connected through the single junction layer 202, so as to increase the height of the overlapping region A between the word line 200 and the source/drain region 102, thereby increasing the driving current of the transistor.

Illustratively, when the voltage applied by the first conductive layer 201 is 3 v, the single junction layer 202 is conductive in a low-resistance state. In this case, the word line 200 includes the first conductive layer 201, the single junction layer 202 and the second conductive layer 203, in which the first conductive layer 201 and the second conductive layer 203 are connected through the single junction layer 202 to increase the overlap region A between the word line 200 and the source/drain region 102. When the voltage applied by the first conductive layer 201 is −0.2 v, the single junction layer 202 is blocked by a high resistance state. In this case, the word line 200 includes the first conductive layer 201. The height of the overlapping region A between the word line 200 and the source/drain region 102 is reduced, and the second conductive layer 203 can also be used for shielding the electric field of the word line 200. Therefore the electric field strength of the overlapping region A of the word line 200 and the source/drain region 102 is reduced, and the GIDL leakage phenomenon is improved.

Figure 7:
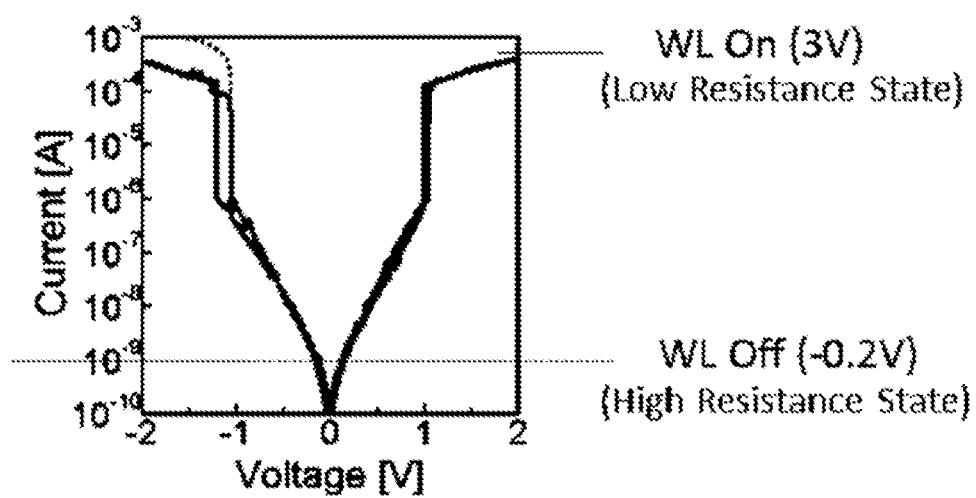
FIG. 7 is a schematic diagram of the relationship between the voltage value and the resistance value of the single junction layer in the on and off states provided by the embodiment of the disclosure.

FIG. 7 is a schematic diagram of the relationship between a voltage value and a resistance value of the single junction layer in on and off states of the embodiments of the disclosure.

Furthermore, it can be seen from FIG. 7 that the conductive current of the single junction layer 202 is greater than or equal to $10^{-4}$ A, and the conductive voltage is greater than or equal to 1.2V, so as to achieve the electrical conduction of the first conductive layer 201 and the second conductive layer 203 through the single junction layer 202; And when the voltage of the single junction layer 202 is greater than the preset voltage, the current increases significantly. Therefore, in order to meet the working reliability of the single junction layer 202, the single junction layer 202 can be made of a material with a high or a low resistance state as the voltage changes.

In the semiconductor structure, the single junction layer 202 is an ovonic threshold switching (OTS) gating material layer.

Illustratively, the single junction layer 202 may be a silicon telluride (SiTe) layer, and the first conductive layer 201 and the second conductive layer 203 may be conductive metal layers. For example, the first conductive layer 201 and the second conductive layer 203 are tungsten (W) layers.

Further, the thickness of the single junction layer 202 may be 5 nm to 25 nm, in which the resistance value of the single junction layer 202 varies with the thickness of the single junction layer 202.

Illustratively, when the single junction layer 202 is a 15 nm SiTe layer, and the first conductive layer 201 and the second conductive layer 203 are tungsten layers, the resistance value of the single junction layer 202 in the off state can be 6 times the resistance value of the single junction layer 202 in the connective state. As shown in FIG. 7, the current value changes from $10^{-10}$ A to $10^{-4}$ A.

According to the semiconductor structure provided by the embodiments of the disclosure, the word line includes a first conductive layer, a single junction layer and a second conductive layer sequentially stacked, in which the first conductive layer is located at the bottom of the word line trench. When the single junction layer is in a conductive state, the first conductive layer and the second conductive layer are connected through the single junction layer, and the overlapping region A between the source/drain region and the word line can attract electrons of the substrate doped region, thereby reducing the resistance of the overlapping region A between the source/drain region and the word line.

However, when the single junction layer is in an off state, the first conductive layer and the second conductive layer are disconnected, so that the voltage of the second conductive layer is 0 V. The second conductive layer can reduce the electric field intensity in the overlapping region A, and mitigate the phenomenon of forming the current due to electrons tunneling between the word line and the source/drain, thereby mitigating the GIDL leakage phenomenon.

Figure 8:
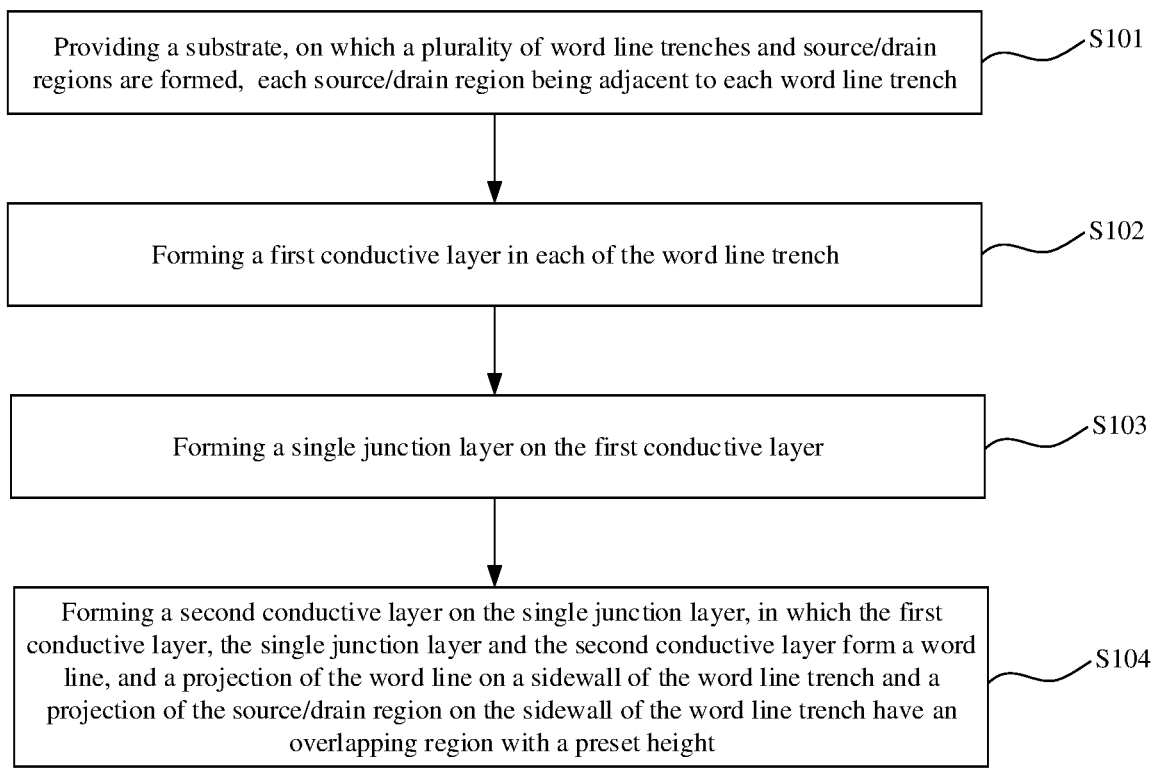
FIG. 8 is a flow diagram of a method for manufacturing method a semiconductor structure provided by an embodiment of the disclosure.

FIG. 8 is a flow diagram of a method for manufacturing a semiconductor structure provided by the embodiments of the disclosure.

As shown in FIG. 8, the embodiments of the disclosure also provide a method for manufacturing a semiconductor structure, which includes the following operations.

At S101: a substrate is provided, and multiple word line trenches and source/drain regions are formed on the substrate, in which each of the source/drain regions adjacent to each of the word line trenches.

At S102: a first conductive layer is formed in each word line trench.

At S103: a single junction layer is formed on the first conductive layer.

At S104: a second conductive layer on the single junction layer is formed, in which the first conductive layer, the single junction layer and the second conductive layer form a word line, and the projection of the word line on a sidewall of the word line trench and the projection of the source/drain region on the sidewall of the word line trench have an overlapping region with a preset height.

In the semiconductor structure, when a voltage applied to the word line is less than a preset voltage, a resistance of the single junction layer is greater than a preset resistance, and the single junction layer is in an off state. The single junction layer is used for blocking the first conductive layer and the second conductive layer, so that the first conductive layer and the second conductive layer are disconnected. When the voltage applied by the single junction layer is greater than the preset voltage, the resistance of the single junction layer is less than the preset resistance, and the single junction layer is in a conductive state, and the single junction layer is used for connection of the first conductive layer and the second conductive layer.

The method for manufacturing the semiconductor structure provided by embodiments of the disclosure includes: providing a substrate, and forming a plurality of word line trenches and source/drain regions on the substrate, in which each of the source/drain regions is adjacent to each of the word line trenches; forming a first conductive layer in each of the word line trench; forming a single junction layer on the first conductive layer; a second conductive layer is formed on the single junction layer, and the first conductive layer, the single junction layer and the second conductive layer form a word line, in which the first conductive layer is located at the bottom of the word line trench; in which when the single junction layer is in a conductive state, the first conductive layer and the second conductive layer are connected through the single junction layer, and the overlapping region of the source/drain region and the word line attract electrons in the doped region of the substrate, thereby reducing the resistance of the overlapping region of the source/drain region and the word line, thereby increasing the driving current of the transistor. While, when the single junction layer is in an off state, the first conductive layer and the second conductive layer are disconnected, so that the voltage of the second conductive layer is 0 V, and the second conductive layer reduces the electric field intensity in the overlapping region, thus mitigates the phenomenon of forming a current due to electrons tunneling between the word line and the source/drain, thereby mitigating the GIDL leakage phenomenon.

In this description, each embodiment or implementation is described in a progressive manner, and each embodiment focuses on the differences from other embodiments, so it is enough to refer to the same and similar parts between each embodiment.

In the description of this specification, referring to the description of the terms "one embodiment", "some embodiments", "illustrative embodiments", "examples", "concrete examples" or "some examples" means that the specific features, structures, materials or characteristics described in connection with the embodiments or examples are included in at least one embodiment or example of the disclosure. In this specification, the schematic expressions of the above terms do not necessarily refer to the same embodiments or examples. Furthermore, the specific features, structures, materials or characteristics described may be combined in any one or more embodiments or examples in a suitable manner.

Finally, it should be noted that the above embodiments are only used for illustrating the technical solutions of the disclosure, but not to limit it; although the disclosure has been described in detail with reference to the foregoing embodiments, ordinary technicians in the field should understand that it is still possible to modify the technical solutions described in the foregoing embodiments, or to replace some or all of their technical features equivalently; however, these modifications or substitutions do not make the essence of the corresponding technical solutions deviate from the scope of the technical solutions of each embodiment of this disclosure.

What is claimed is:

1. A semiconductor structure, comprising:
    a substrate, having a plurality of word line trenches and source/drain regions each adjacent to each word line trench; and
    a plurality of word lines, each located in each word line trench and each comprising a first conductive layer, a single junction layer and a second conductive layer stacked in sequence, wherein, the first conductive layer is located at a bottom of the word line trench; a projection of the word line on a sidewall of the word line trench and a projection of a source/drain region on the sidewall of the word line trench have an overlapping region with a preset height; and in the case that a voltage applied to the word line is less than a preset voltage, a resistance of the single junction layer is greater than the preset resistance, to make the first conductive layer and the second conductive layer disconnected.

2. The semiconductor structure according to claim 1, wherein a projection of at least part of the second conductive layer on the sidewall of the word line trench is located within the projection of the source/drain region on the sidewall of the word line trench.

3. The semiconductor structure according to claim 2, wherein a top of the first conductive layer is lower than a bottom of the source/drain region.

4. The semiconductor structure according to claim 2, wherein a top of the second conductive layer is flush with a top of the source/drain region.

5. The semiconductor structure according to claim 3, wherein a top of the second conductive layer is flush with a top of the source/drain region.

6. The semiconductor structure according to claim 2, wherein the projection of the source/drain region on the sidewall of the word line trench covers a projection of the second conductive layer on the sidewall of the word line trench.

7. The semiconductor structure of claim 1, wherein the preset resistance is a critical resistance of electrical connection of the first conductive layer and the second conductive layer.

8. The semiconductor structure claim 1, wherein the single junction layer comprises a first resistance and a second resistance, wherein the first resistance is greater than the second resistance; in the case that the single junction layer is in a conductive state, the resistance of the single junction layer is the second resistance; and in the case that the single junction layer is in an off state, the resistance of the single junction layer is the first resistance.

9. The semiconductor structure according to claim 8, wherein a conductive current of the single junction layer is $10^{-4}$ A or more, and a conductive voltage is 1.2 V or more.

10. The semiconductor structure according to claim 8, wherein the single junction layer is an OTS gating material layer.

11. The semiconductor structure of claim 10, wherein the single junction layer is a silicon telluride (SiTe) layer.

12. The semiconductor structure according to claim 8, wherein a thickness of the single junction layer is 5 nm to 25 nm.

13. The semiconductor structure according to claim 12, wherein the thickness of the single junction layer is 15 nm.

14. The semiconductor structure according to claim 1, wherein the first conductive layer and/or the second conductive layer is a conductive metal layer.

15. The semiconductor structure according to claim 14, wherein the first conductive layer and/or the second conductive layer is a tungsten (W) layer.

16. A manufacturing method of a semiconductor structure, comprising:
    providing a substrate, on which a plurality of word line trenches and source/drain regions are formed, where each of the source/drain regions is adjacent to each of the word line trenches;
    forming a first conductive layer in each of the word line trenches;
    forming a single junction layer on the first conductive layer; and
    forming a second conductive layer on the single junction layer, wherein the first conductive layer, the single junction layer and the second conductive layer form a word line, and a projection of the word line on a sidewall of the word line trench and a projection of the source/drain region on the sidewall of the word line trench have an overlapping region with a preset height; and in the case that a voltage applied to the word line is less than a preset voltage, a resistance of the single junction layer is greater than the preset resistance, to make the first conductive layer and the second conductive layer disconnected.

* * * * *